United States Patent
Lai et al.

(10) Patent No.: US 7,535,081 B2
(45) Date of Patent: May 19, 2009

(54) METAL NANOLINE PROCESS AND APPLICATIONS ON GROWTH OF ALIGNED NANOSTRUCTURE THEREOF

(75) Inventors: Ming-Jiunn Lai, Taichung (TW); Jeng-Hua Wei, Taipei (TW); Hung-Hsiang Wang, Taipei (TW); Po-Yuan Lo, Taipei (TW); Ming-Jer Kao, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 228 days.

(21) Appl. No.: 10/968,891

(22) Filed: Oct. 21, 2004

(65) Prior Publication Data

US 2005/0233585 A1 Oct. 20, 2005

(30) Foreign Application Priority Data

Apr. 16, 2004 (TW) .............................. 93110643 A

(51) Int. Cl.
*H01L 29/06* (2006.01)

(52) U.S. Cl. .................. 257/618; 257/E51.04; 977/742
(58) Field of Classification Search ................. 977/742, 977/748, 762, 938, 842, 843; 257/E51.04, 257/618; 438/478
See application file for complete search history.

(56) References Cited

U.S. PATENT DOCUMENTS 6,350,488 B1 * 2/2002 Lee et al. ................. 427/249.1
6,833,558 B2 * 12/2004 Lee et al. ..................... 257/49
7,033,647 B2 * 4/2006 Tang et al. .................. 427/533

* cited by examiner

*Primary Examiner*—David Vu
(74) *Attorney, Agent, or Firm*—Birch, Stewart, Kolasch & Birch, LLP

(57) ABSTRACT

A metal nanoline process and applications on growth of aligned nanostructures thereof. A nano-structure is provided with a substrate with at least one nanodimensional metal catalyst line disposed thereon and at least one carbon nanotube or silicon nanowire extending along an end of the metal catalyst line.

14 Claims, 10 Drawing Sheets

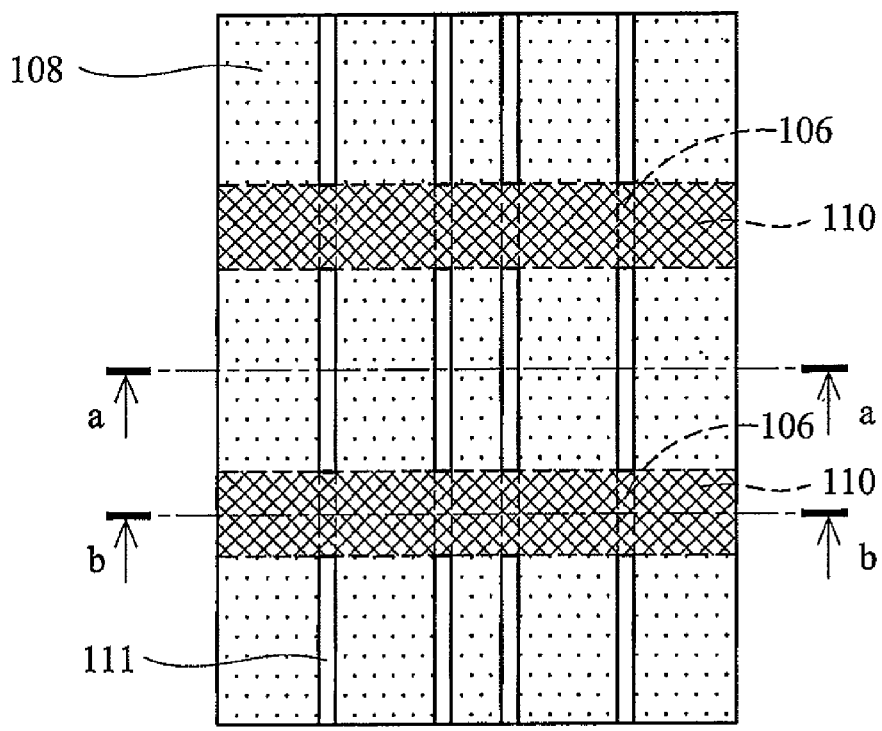
FIG. 6a
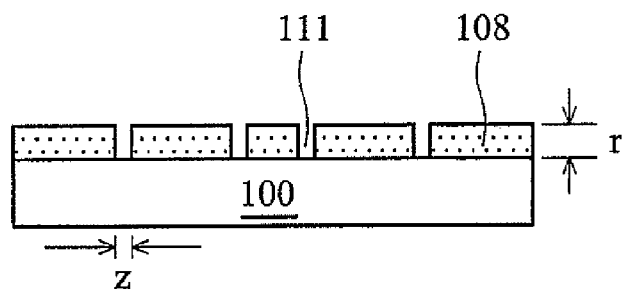
FIG. 6a1
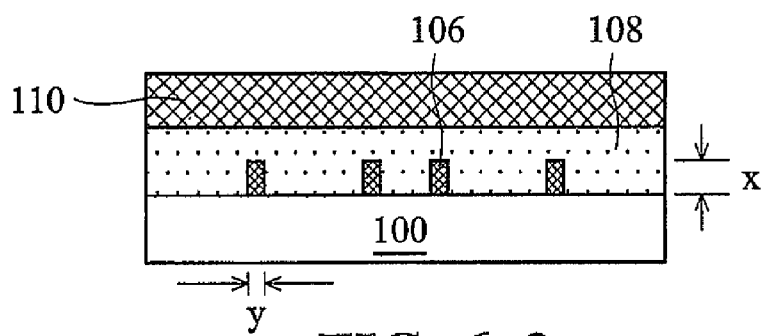
FIG. 6a2

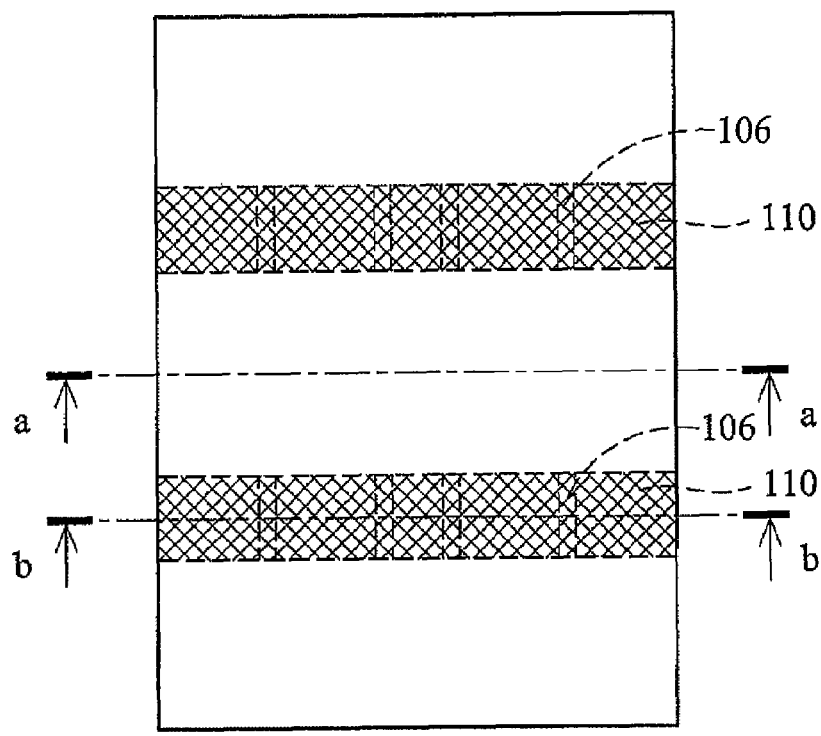
FIG. 6b
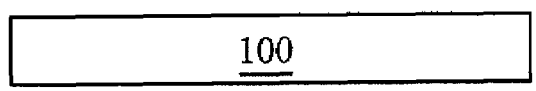
FIG. 6b1
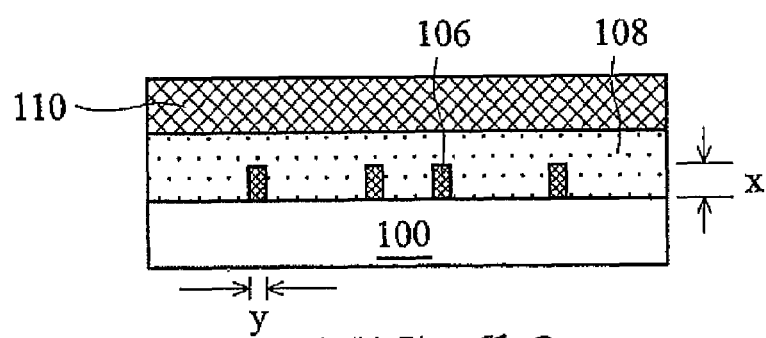
FIG. 6b2

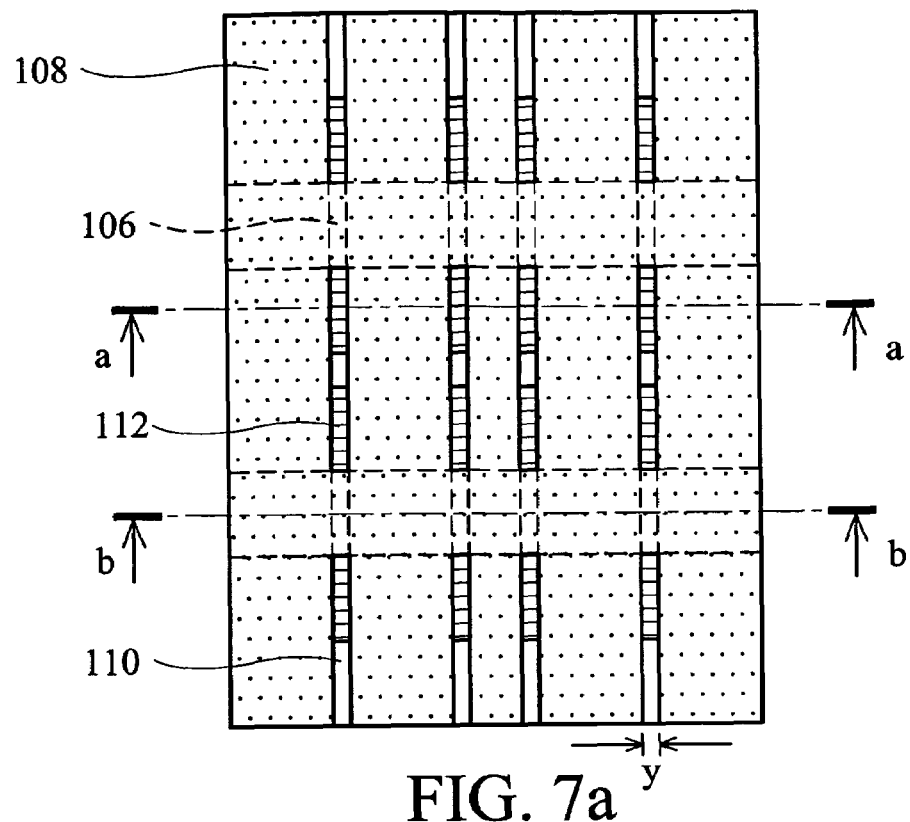
FIG. 7a
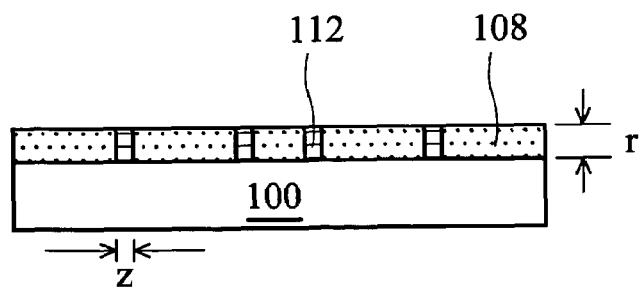
FIG. 7a1
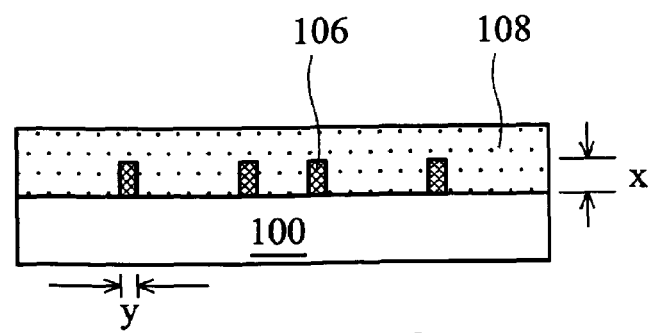
FIG. 7a2

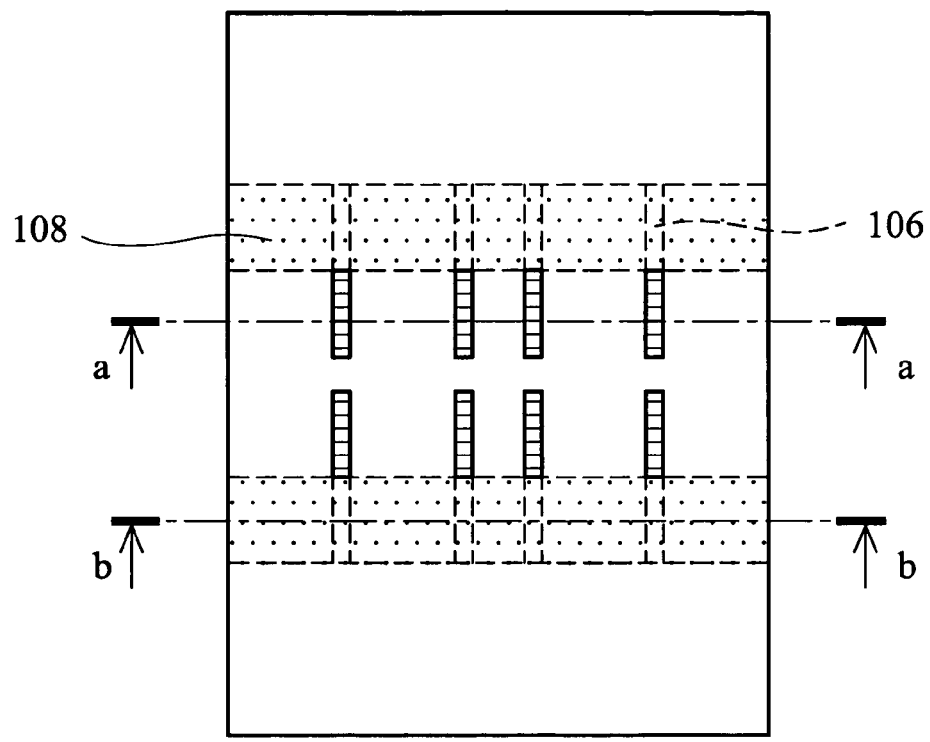
FIG. 7b
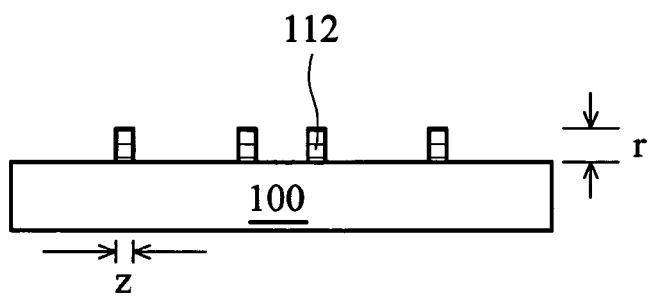
FIG. 7b1
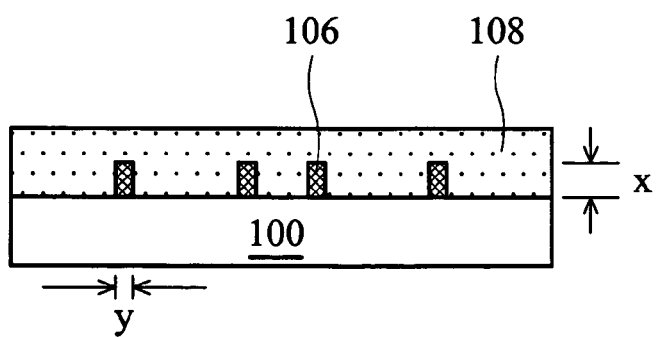
FIG. 7b2

METAL NANOLINE PROCESS AND APPLICATIONS ON GROWTH OF ALIGNED NANOSTRUCTURE THEREOF

This Nonprovisional application claims priority under 35 U.S.C. § 119(a) on Patent Application No(s). 093110643 filed in Taiwan, Republic of China on Apr. 16, 2004, the entire contents of which are hereby incorporated by reference.

BACKGROUND OF THE INVENTION

1. Field of the Invention

The invention relates to a method for forming metal catalyst nanolines by a semiconductor fabrication technique, and more particularly to a nanostructure, such as a carbon nanotube or silicon nanoline, formed by the metal catalyst nanoline and a method for fabricating the same.

2. Brief Discussion of the Related Art

Nanodevice fabrication using carbon nanotubes and silicon nanolines is a popular subject in industry and various nanodevices have been fabricated and proof to have certain functionality. Alignment of carbon nanotubes and silicon nanolines, however, is still problematic and operative nanodevices are randomly fabricated. Thus, applications of carbon nanotubes and silicon nanolines are thus limited.

Alignment of carbon nanotubes and silicon nanolines can be presently achieved by using, for example, external electric field, patterned surface treatment, and microchannels. Problems such as unstable process reliability and misalignments, however, still happen when forming nanostructures over a large area. Additionally, aligned growth of the carbon nanotubes and silicon nanolines by sequentially patterning a catalyst layer by photolithography and etching a metal catalyst surface are not easily achieved. Thus, nanodimensional structures cannot be patterned by photolithography, so the surface of catalyst layer is much larger than carbon nanotube and silicon nanoline diameters, causing simultaneous formation of multiple carbon nanotubes and silicon nanolines in a complex alignment. Thus, the surface of the catalyst must be reduced to avoid intersecting multiple carbon nanotubes and silicon nanolines.

According, a method of aligned growth of carbon nanotubes and silicon nanolines over a large area with improved process reliability and increased commercial viability is desirable.

SUMMARY OF THE INVENTION

Embodiments of the invention provide method for forming nanodimensional metal catalyst lines. In the method, a substrate is first provided. A metal layer of nano-thickness is then formed over the substrate. Next, at least one photoresist pattern is formed over the metal layer. The metal layer exposed by the photoresist pattern is then removed using the photoresist pattern layer as an etching mask to form at least one metal pattern of nano-thickness on the substrate. Next, a plurality of metal catalyst lines are formed on sidewalls of the metal pattern by plating using the photoresist pattern as a mask, wherein the metal pattern and the metal catalyst lines are of nano-thickness. Next, the photoresist pattern is removed and the remaining metal layer is also removed to leave the metal catalyst lines of nano-thickness.

Embodiments of the invention provide with a method for forming aligned nanostructures. In the method, a substrate with at least one metal catalyst nanoline formed thereon is first provided. Next, a sacrificial layer is formed over the substrate and the metal catalyst nanoline. Next, at least one photoresist pattern is formed over the sacrificial layer to exposing an area of the sacrificial layer for forming nanostructures. Next, the sacrificial layer and the underlying metal catalyst nanoline exposed by the photoresist pattern are removed to expose a portion of the substrate, wherein at least one cross section of the metal catalyst nanoline is exposed at a margin of the nanotubes or nanowires formation area. Next, the photoresist pattern is removed to expose the metal catalyst nanoline. Next, carbon nanotubes or silicon nanowires are formed from the cross sections of the metal catalyst nan-line and along the length thereof and the sacrificial layer is removed to leave the carbon nanotubes or silicon nanowires on the substrate.

Also provided is a nanostructure with a substrate, at least one nanodimensional metal catalyst line disposed on the substrate and at least one carbon nanotube or silicon nanowire extending along an end of the metal catalyst line.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only and thus are not limitative of the present invention.

FIGS. 1a-3a are schematic top views and FIGS. 1b-3b are cross sections, illustrating a method for forming metal catalyst lines;

FIG. 6a is a top view and FIGS. 6a1 and 6a2 are cross sections illustrating an example for removing unwanted areas from a substrate;

FIG. 6b is a top view and FIGS. 6b1 and 6b2 are cross sections illustrating another example for removing unwanted areas from a substrate;

FIG. 7a is a top view and FIGS. 7a1 and 7a2 are cross sections, illustrating an example of forming carbon nanotubes and silicon nanolines;

FIG. 7b is a top view and FIGS. 7b1 and 7b2 are cross sections both illustrating another example of forming carbon nanotubes and silicon nanolines.

DETAILED DESCRIPTION

FIGS. 1a-3a are top views and FIGS. 1b-3b are cross sections illustrating a method for forming metal catalyst nanolines.

Figure 1A:
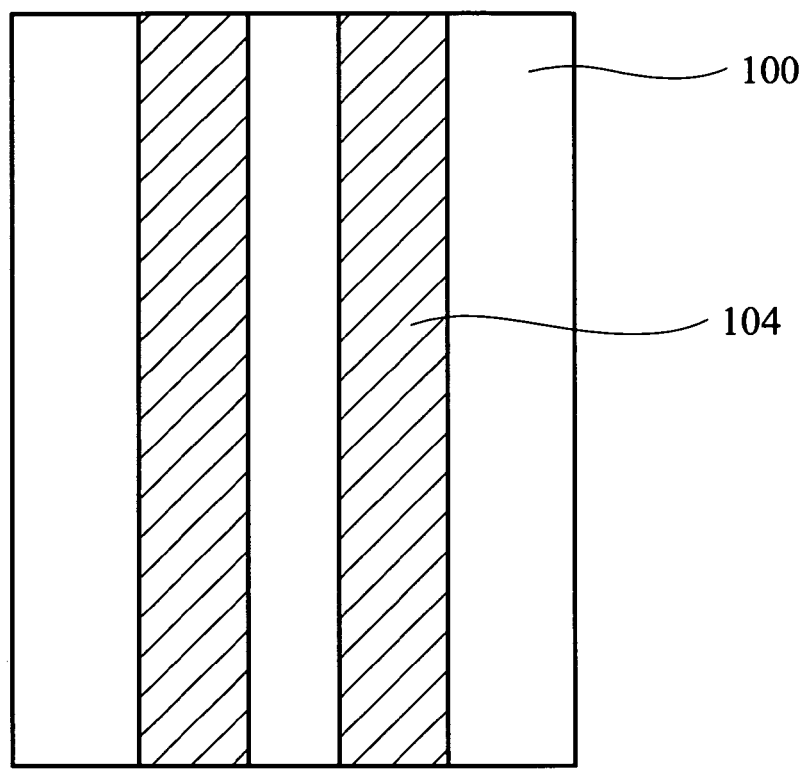
Figure 1B:
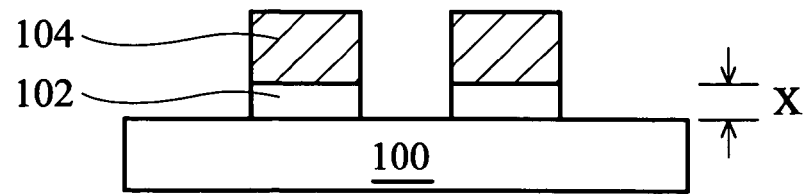

In FIGS. 1a and 1b, a substrate 100 composed of, for example, silicon dioxide or silicon nitride is first provided. Next, a copper layer 102 with nanothickness x is formed on the substrate 100 by, for example, physical vapor deposition (PVD), electrochemical deposition (ECD), or spin coating, wherein the electrochemical deposition can be either electroplating or electroless plating. The thickness x of the copper layer 102 can be controlled to be less than 10 nm, thereby thickness of a sequentially formed metal catalyst line can thus be determined.

Figure 2A:
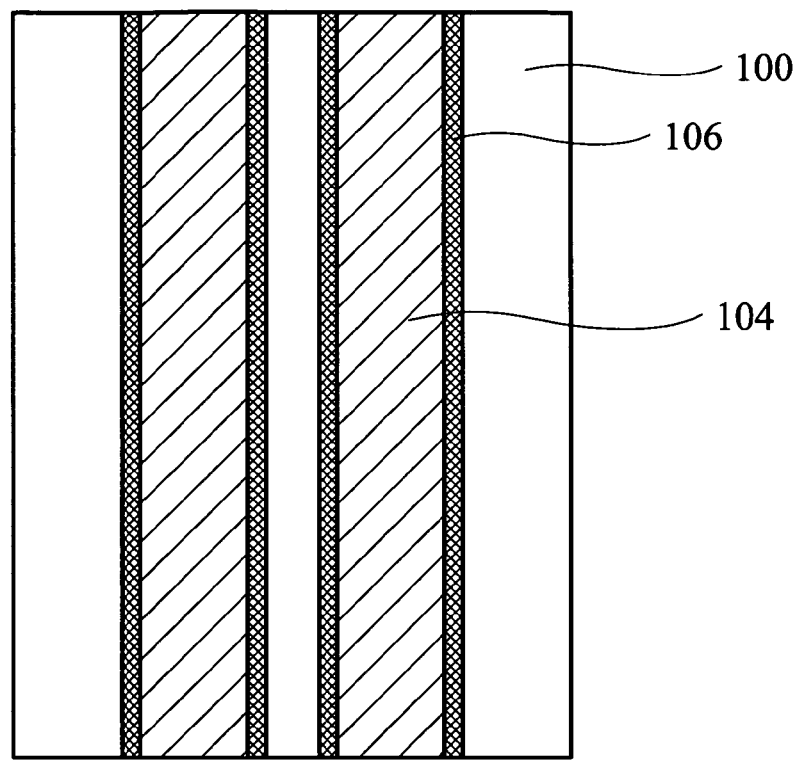
Figure 2B:
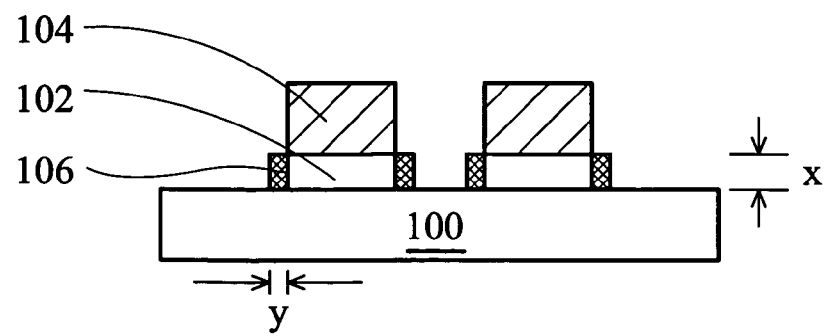

Next, in FIGS. 2a and 2b, a plurality of photoresist patterns 104 is formed on the copper layer 102 by sequential photolithography and etching on a photoresist layer (not shown), to function as etching masks in subsequent processes. The underlying copper layer 102 is then etched using the photoresist patterns 104 as an etching mask, thus forming nanothick copper patterns 102. Next, a plurality of metal catalyst lines 106 are formed on sidewalls of each copper layer 102 by, for example, electroplating or electroless plating, each having a thickness x and width y controlled to be under 10 nm. Herein, each metal catalyst line 106 may comprise metal such as iron, cobalt, nickel, gold, silver, copper, platinum, titanium, and combinations thereof, but not limited thereto, other suitable catalysts can be also adopted by those skilled in the art. Herein, either the thickness or the width of each metal catalyst line 106 of a nanodimension can be formed by precisely controlling plating currents and process time of the electrochemical plating.

Figure 3A:
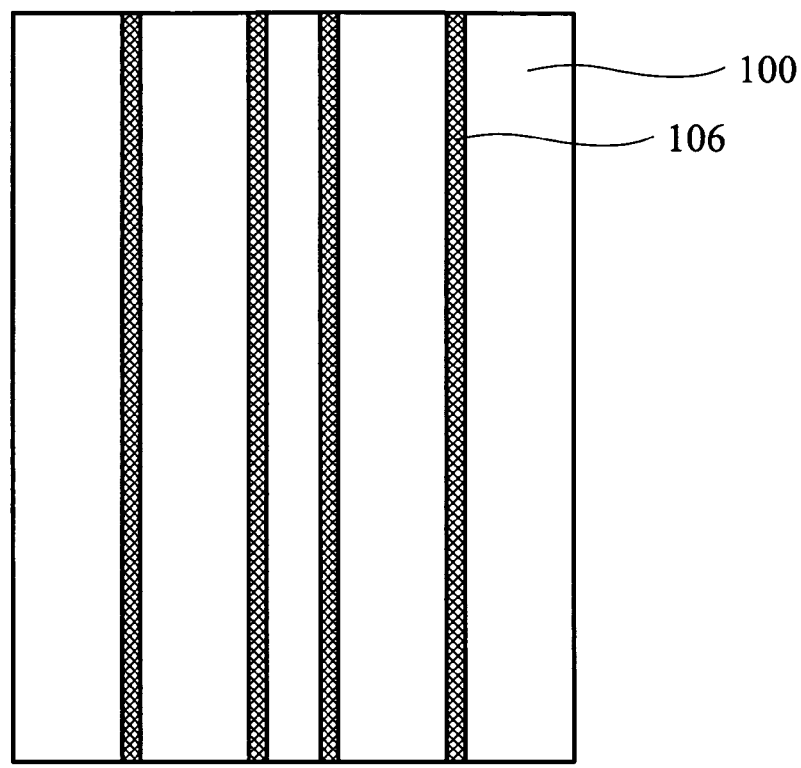
Figure 3B:
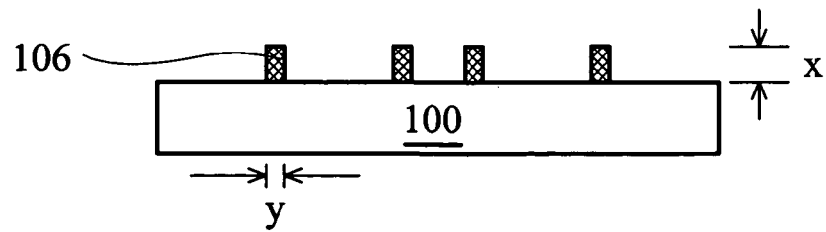

In FIGS. 3a and 3b, etching such as dry etching, wet etching or a combination thereof, is sequentially performed to first remove the photoresist patterns 104 and then the metal patterns 102, leaving metal catalyst lines 106 on the substrate 100.

Herein, the thickness x and the width y of each metal catalyst line 106 is precisely controlled to be less than 100 nm by the described two step deposition. Due to the similar nanodimensions of the metal catalyst lines 106, a single carbon nanotube or single silicon nanoline is only formed on a surface of each metal catalyst line 106, thus preventing complex growth and alignments of multiple carbon nanotubes or silicon nanolines on a metal catalyst with a large surface.

FIGS. 4a-5a, 6a-6b, 7a-7b and 8 are top views and FIGS. 4b-5b, 6a1-6a2, 6b1-6b2, 7a1-7a2, 7b1-7b2 and 8a-8b are cross sections, illustrating a method for forming aligned carbon nanotubes or silicon nanolines according to an embodiment of the invention.

Figure 4A:
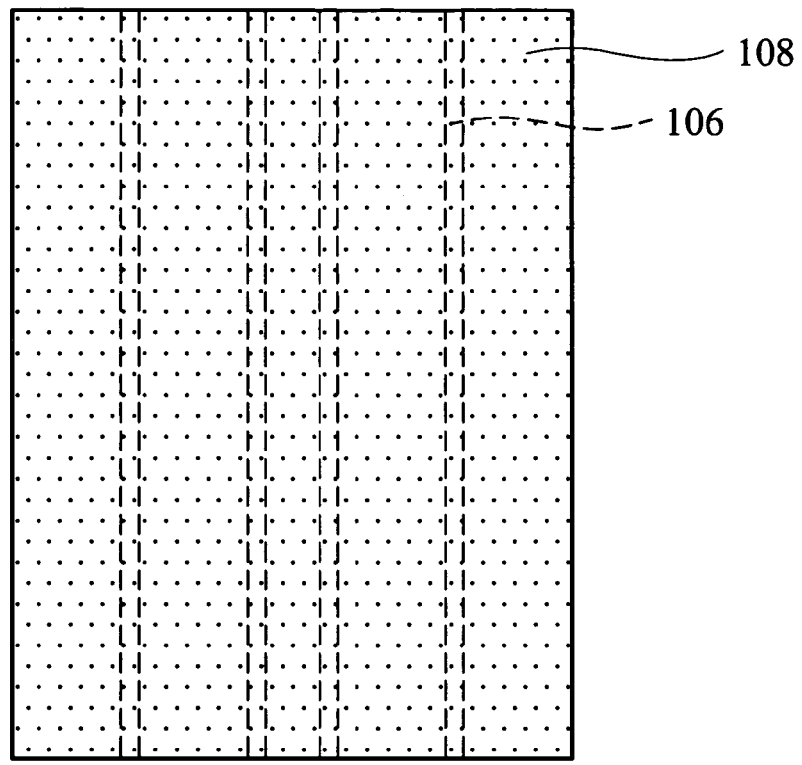
FIG. 4a is a top view and FIG. 4b is a cross section illustrating a substrate with metal catalyst nanolines patterned thereon, covered by a sacrificial layer.
Figure 4B:
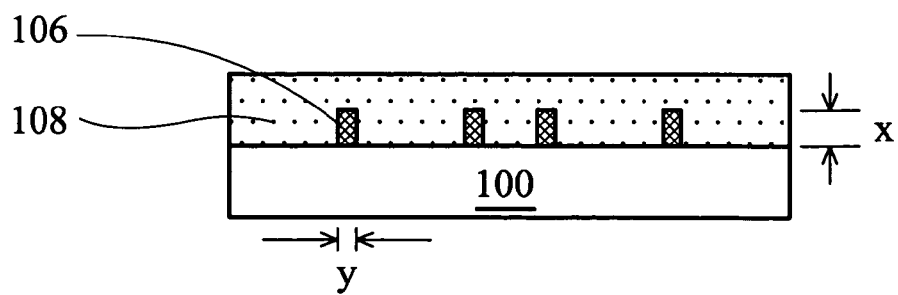

In FIGS. 4a and 4b, a substrate 100 with a plurality of nanodimensional metal catalyst lines 106 formed thereon, as shown in FIGS. 3a and 3b, is first provided. The substrate 100 can comprise, for example, silicon dioxide or silicon nitride. Next, a blanket dielectric layer such as a silicon dioxide layer is formed on the substrate 100 by, for example, chemical vapor deposition (CVD), functioning as a sacrificial layer 108.

Figure 5A:
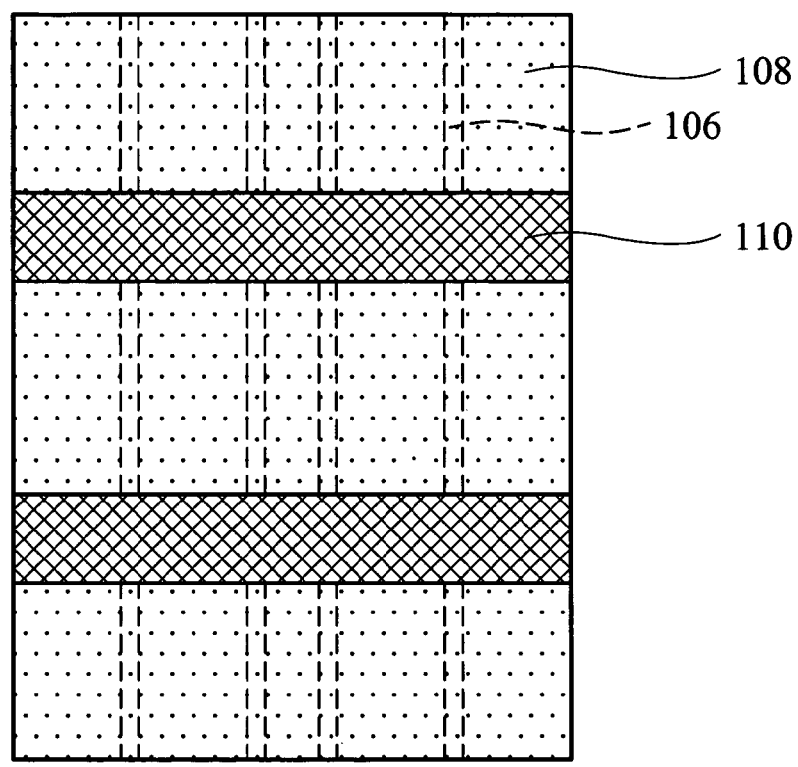
FIG. 5a is a top view and FIG. 5b is a cross section, respectively illustrating the substrate shown in FIGS. 4a and 4b covered by a plurality of photoresist patterns.
Figure 5B:
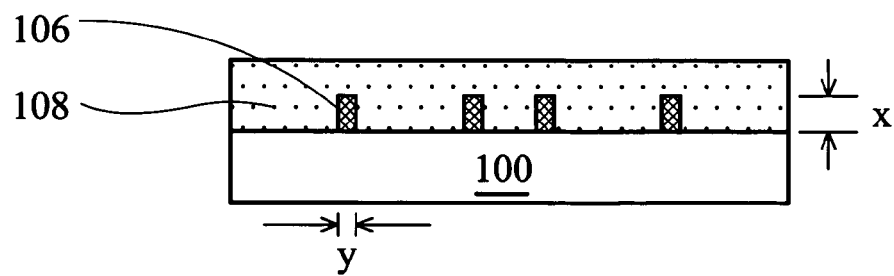

In FIGS. 5a and 5b, a plurality of photoresist patterns 110 are then formed on the sacrificial layer 108, covering areas functioning as catalyst and exposure areas for forming nanostrucutres such as carbon nanotubes or silicon nanolines.

Next, at least portions of the sacrificial layer 108 and the metal catalyst lines 106 are removed to expose areas for forming carbon nanotubes or silicon nanolines. Herein, two examples are provided for removing the sacrificial layer 108 and the metal catalyst lines 106 in the areas for forming carbon nanotubes or silicon nanolines. In one example, the portion of the sacrificial layer 108 exposed by the photoresist patterns 110 are first removed until the metal catalyst lines in the areas are exposed, as shown in FIGS. 6a and 6a1. Next, the exposed metal catalyst lines 106 are then selectively removed to leave a plurality of nanodimensional trenches as regions 111 for forming carbon nanotubes or silicon nanolines and the edge of each region 111 exposes a cross section of the metal catalyst line 106 therein. In FIG. 6a1, a cross section along line a-a in FIG. 6a is illustrated, showing a structure after removal of the metal catalyst line 106 in the region 111. In FIG. 6a2, a cross section along line b-b in FIG. 6a is illustrated, showing a structure with the metal catalyst lines 106 covered by the sacrificial layer 108 and the photoresist pattern 110.

In another example, the sacrificial layer 108 and the metal catalyst lines 106 exposed by the photoresist patterns 110 are all removed to expose the substrate 100 thereunder as areas 111 for forming carbon nanotubes or silicon nanolines. Edges of each area 111 expose cross sections of the metal catalyst line 106. Herein, in FIG. 6a1, a cross section along line a-a in FIG. 6b is illustrated, showing a structure after removal of the sacrificial layer 108 and the metal catalyst line 106 in the region 111. In FIG. 6b2, a cross section along line b-b in FIG. 6b is illustrated, showing a structure with the metal catalyst lines 106 covered by the sacrificial layer 108 and the photoresist pattern 110. The structure in the areas covered by the photoresist patterns 110 remains after the described removal of the sacrificial layer 108 and the metal catalyst lines 106 without further processing. In the described examples, the substrate 100 shows a smaller etching rate than the sacrificial layer 108 during the removal thereof.

The photoresist patterns 110 are then removed to expose the remaining metal catalyst lines 106. Steps for forming nanostructures such as the carbon nanotubes or silicon nanolines are then performed. Two examples for forming nanostructures such as carbon nanotubes or silicon nanolines are illustrated herein according to different methods for removing the sacrificial layer and metal catalyst lines.

In one example, the structure shown in FIG. 6a is then disposed in a chemical vapor deposition (CVD) chamber with silicon-containing or carbon-containing gases and carbon nanotubes or silicon nanolines 112 with thickness r and width z less than 10 nm can be thus formed from the cross sections of the metal catalyst line 106 to the regions 111, as shown in FIGS. 7a. FIG. 7a1 illustrates a cross section along line a-a of FIG. 7a, showing carbon nanotubes or silicon nanolines 112 formed in regions 111. FIG. 7a2 illustrates a cross section along line b-b of FIG. 7a, showing areas with metal catalyst lines 106 therein.

Herein, when forming carbon nanotubes 112, the substrate 110 with areas 112 for forming the same is disposed in a microwave plasma reaction chamber with carbon-containing gases such as methane, ethane, propane, acetylene, benzene and mixtures thereof and a chemical vapor deposition (CVD) is thus performed. The metal catalyst lines 106 can be composed of iron, cobalt, nickel and combinations thereof. Conditions in the microwave plasma reaction chamber when performing the CVD are microwave power between about 100~5000 W, synthesizing pressure between about 1* $10^{-3}$~100 Torr, DC bias between about −50~−100 volts and temperature between about 300~1500° C. In addition, when forming silicon nanolines 112, the substrate 110 with areas 112 for forming the same is disposed in a microwave plasma reaction chamber with carbon-containing gases such as $SiH_4$, $Si_2H_6$, and $Si_2H_2Cl_2$ and then a chemical vapor deposition (CVD) is performed. The metal catalyst lines 116 can comprise iron, cobalt, nickel and combinations thereof. Conditions in the microwave plasma reaction chamber when performing the CVD are microwave power between about 100~5000 W, synthesizing pressure between about 1* $10^{-3}$~100 Torr, DC bias between about −50~−100 volts and temperature between about 300~1500° C.

In another example, the structure shown in FIG. 6a is then disposed in a chemical vapor deposition (CVD) chamber with silicon-containing or carbon-containing gases and carbon nanotubes or silicon nanolines 112 with a thickness r and a width z less than 10 nm can be thus formed from the cross sections of the metal catalyst line 106 on the substrate 100, as shown in FIG. 7b. FIG. 7b1 illustrates a cross section taken along line a-a of FIG. 7b, showing carbon nanotubes or silicon nanolines formed on the substrate 100. FIG. 7b2 illustrates a cross section taken along line b-b of FIG. 7b, showing areas having metal catalyst lines 106. Herein, the carbon nanotubes or silicon nanolines 112 are aligned formed when only a catalyst surface needed and formation thereof can be self aligned along a direction perpendicular to the catalyst surface.

Figure 8:
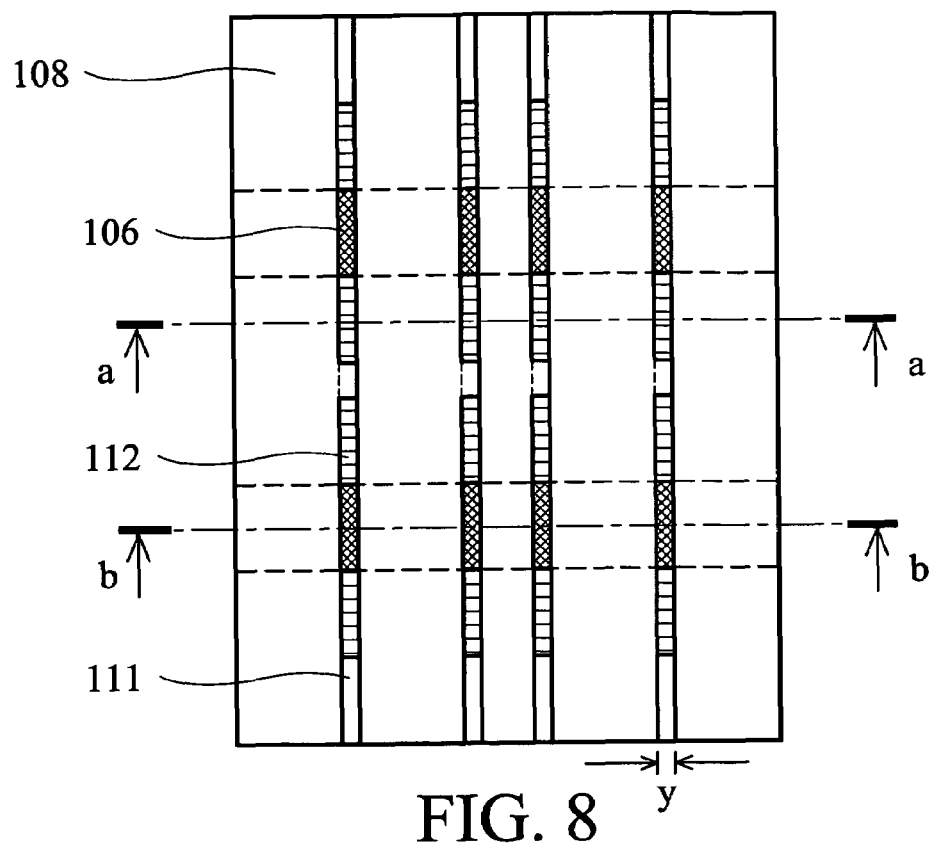
FIG. 8 is a top view and FIGS. 8a and 8b are cross sections, both illustrating a substrate with metal catalyst nanolines, and carbon nanotubes and silicon nanolines within nanotrenches.
Figure 8A:
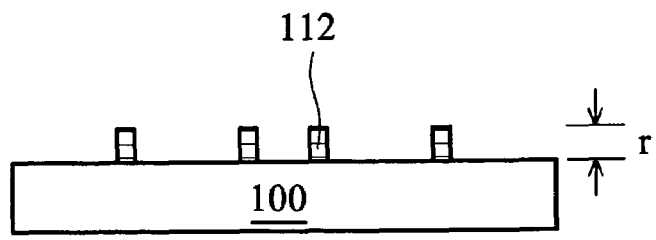
Figure 8B:
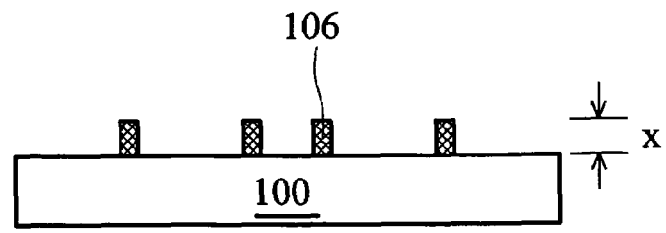

Finally, as shown in FIGS. 8, 8a and 8b, the remaining sacrificial layer 108 in FIG. 7a or 7b is then removed to leave nanodimensional carbon nanotubes or silicon nanolines 112 and metal catalyst lines 106 with. FIG. 8a illustrates a cross section along line a-a of FIG. 8, showing the carbon nanotubes or silicon nanolines 112. FIG. 8b illustrates a cross section along line b-b of FIG. 8, showing the metal catalyst lines 106. Due to formation of the carbon nanotubes or silicon nanolines along a cross section of the metal catalyst line 106, a substantially similar thickness x and r and width y and z can be achieved.

The nanostructures such as carbon nanotubes or silicon nanolines of embodiments of the invention are formed using cross sections of a metal catalyst line and processes for semiconductor fabrication, thus providing methods for forming aligned carbon nanotubes or silicon nanolines over large areas. Nanodevices with improved yield can be provided on wafers of larger sizes, thus increasing commercial nanodevices value.

Moreover, as shown in FIG. 8, a structure having carbon nanotubes or silicon nanolines is provided with a substrate 100 comprising, for example, silicon nitride or silicon dioxide, at least one. nanodimensional metal catalyst line 106 disposed on the substrate, and at least one carbon nanotube or silicon nanowire 112 extending along an end of the metal catalyst line 106.

Accordingly, some embodiments of the invention may include potential advantages of:

The metal catalyst lines are nanodimensional;

Multiple carbon nanotubes or silicon nanolines can be formed on larger surface with complex arrangement Carbon nanotubes or silicon nanolines can be precisely aligned and formed on a large surface;

The described methods of some embodiments of the invention can be applied to large wafers and increase commercial values of nanodevices.

While the invention has been described in terms of several embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An aligned nanostructure, comprising:
a substrate;
at least one nanodimensional metal catalyst line disposed on the substrate;
a sacrificial layer formed over a top surface of the at least one nanodimensional metal catalyst line and a top surface of the substrate;
at least one nanodimendional trench formed in the sacrificial layer over the substrate, exposing a portion of the substrate and the at least one sidewall of the at least one nanodimendional metal catalyst line; and
at least one carbon nanotube or silicon nanowire extending along the at least one sidewall of the at least one nanodimendional metal catalyst line and at least filling portions of the at least one nanodimendional trench, wherein the at least one carbon nanotube or silicon nanowire is also formed on portions of the substrate exposed by at least one nanodimendional trench.

2. The nanostructure as claimed in claim 1, wherein the carbon nanotube or the silicon nanowire extends along a direction perpendicular to a cross section of the metal catalyst line.

3. The nanostructure as claimed in claim 1, wherein the substrate comprises silicon dioxide or silicon nitride.

4. The nanostructure as claimed in claim 1, wherein the metal catalyst lines comprise a metal selected from the group consisting of iron, cobalt, nickel, gold, silver, copper, platinum, titanium, and a combination thereof.

5. The nano-structure as claimed in claim 1, wherein the metal catalyst line is formed by electroplating or electroless plating.

6. The nanostructure as claimed in claim 1, wherein the carbon nanotube is formed by disposing the metal catalyst line in a microwave plasma reaction chamber with carbon-containing reactants during a chemical vapor deposition.

7. The nanostructure as claimed in claim 6, wherein the carbon-containing reactants are selected from a group consisting of methane, ethane, propane, acetylene, benzene and mixtures thereof.

8. The nanostructure as claimed in claim 6, wherein the carbon-containing reactants are selected from a group consisting of iron, cobalt, nickel and combinations thereof.

9. The nanostructure as claimed in claim 6, wherein the microwave plasma reacting chamber is operated under microwave power between about 100~5000 W, synthesizing pressure between about $1*10^{-3}$~100 Torr, DC bias between about −50~−100 volts and temperature between about 300~1500° C.

10. The nanostructure as claimed in claim 1, wherein the silicon nanoline is formed by disposing the metal catalyst line in a microwave plasma reaction chamber with silicon-containing reactants during a chemical vapor deposition.

11. The nanostructure as claimed in claim 10, wherein silicon-containing reactant is selected from a group consisting of $SiH_4$, $Si_2H_6$, and $Si_2H_2Cl_2$.

12. The nanostructure as claimed in claim 10, wherein metal catalyst nanoline comprises comprise a metal selected from the group consisting of iron, cobalt, nickel and combinations thereof.

13. The nanostructure as claimed in claim 10, wherein the microwave plasma reaction chamber is operated under microwave power between about 100~5000 W, synthesizing pressure between about $1*10^{-3}$~100 Torr, DC bias between about −50~−100 volts and temperature between about 300~1500° C.

14. The nanostructure as claimed in claim 10, wherein the metal catalyst line, the carbon nanotube and the silicon nanowire have a thickness and width less than 10 nm.

* * * * *